US011120978B2

(12) United States Patent
Kester et al.

(10) Patent No.: US 11,120,978 B2
(45) Date of Patent: Sep. 14, 2021

(54) SYSTEM AND METHOD TO INCREASE SURFACE FRICTION ACROSS A HYDROPHOBIC, ANTI-FOULING, AND OLEOPHOBIC COATED SUBSTRATE

(71) Applicant: Quantum Innovations, Inc., Central Point, OR (US)

(72) Inventors: Norman L. Kester, Rogue River, OR (US); Peter Voin, Medford, OR (US); Danny Charles Gilkison, Gold Hill, OR (US); Philip H. Post, Talent, OR (US); John B. Glarum, Rogue River, OR (US)

(73) Assignee: QUANTUM INNOVATIONS, INC., Central Point, OR (US)

( * ) Notice: Subject to any disclaimer, the term of this patent is extended or adjusted under 35 U.S.C. 154(b) by 0 days.

(21) Appl. No.: 16/674,905

(22) Filed: Nov. 5, 2019

(65) Prior Publication Data
US 2020/0243316 A1    Jul. 30, 2020

Related U.S. Application Data

(60) Provisional application No. 62/798,366, filed on Jan. 29, 2019.

(51) Int. Cl.
*H01J 49/02* (2006.01)
*H01J 49/16* (2006.01)
(Continued)

(52) U.S. Cl.
CPC .......... *H01J 49/022* (2013.01); *C09D 5/1681* (2013.01); *H01J 37/3056* (2013.01);
(Continued)

(58) Field of Classification Search
CPC ...... H01J 49/022; H01J 49/164; H01J 49/165; H01J 37/317; H01J 37/3174;
(Continued)

(56) References Cited

U.S. PATENT DOCUMENTS 3,437,734 A   4/1969  Roman et al.
5,171,623 A   12/1992 Yee
(Continued)

*Primary Examiner* — David E Smith
(74) *Attorney, Agent, or Firm* — Jerry Haynes Law

(57) ABSTRACT

A system and method to increase surface friction across a hydrophobic, anti-fouling, and oleophobic coated substrate. The substrate has a hydrophobic surface defined by a surface friction. The system works to increases the surface friction, or roughness, across the hydrophobic surface. The increase in surface friction is accomplished by generating power through an ion source to create an ion cloud. The ion cloud is generated in proximity to the substrate. The ions interact with the hydrophobic surface to create a roughing effect thereon. A gas carrier device introduces an inert carrier gas through the ion cloud to increase density of the ions, which in turn increases surface friction. The system is variable, selectively increasing and decreasing surface friction by: varying the duration that the hydrophobic surface is exposed to the ion cloud; varying power applied to ion source; and varying distance between the ion cloud and the hydrophobic surface.

15 Claims, 3 Drawing Sheets

(51) Int. Cl.
*H01J 37/317* (2006.01)
*C09D 5/16* (2006.01)
*H01J 49/14* (2006.01)
*H01J 37/305* (2006.01)

(52) U.S. Cl.
CPC .......... *H01J 37/317* (2013.01); *H01J 49/147* (2013.01); *H01J 49/164* (2013.01); *H01J 49/165* (2013.01); *H01J 2237/3174* (2013.01)

(58) Field of Classification Search
CPC ... H01J 37/3056; C09D 5/1681; B01D 65/08; B08B 17/02; B08B 17/06
See application file for complete search history.

(56) References Cited

U.S. PATENT DOCUMENTS

| | | | |
|---|---|---|---|
| 5,902,360 | A | 5/1999 | Linzell |
| 7,531,598 | B2 | 5/2009 | Muller et al. |
| 7,985,475 | B2 | 7/2011 | Dubrow |
| 8,252,732 | B2 | 8/2012 | Al-Lamee et al. |
| 2005/0061221 | A1 | 3/2005 | Paszkowski |
| 2009/0294404 | A1* | 12/2009 | Colpo ............... C23C 26/00 216/67 |
| 2010/0330278 | A1 | 12/2010 | Choi et al. |
| 2011/0051220 | A1 | 3/2011 | Lee |
| 2012/0237777 | A1* | 9/2012 | Lu ............... C09D 183/12 428/421 |
| 2012/0315082 | A1 | 12/2012 | Linzell |
| 2015/0262859 | A1* | 9/2015 | Balasubramanian ............... C23C 16/505 438/758 |
| 2018/0187310 | A1* | 7/2018 | Hsieh ............... H01J 37/32917 |

\* cited by examiner

SYSTEM AND METHOD TO INCREASE SURFACE FRICTION ACROSS A HYDROPHOBIC, ANTI-FOULING, AND OLEOPHOBIC COATED SUBSTRATE

CROSS-REFERENCE TO RELATED APPLICATIONS

This application claims the benefit of U.S. provisional application No. 62/798,366, filed Jan. 29, 2019 and entitled SYSTEM AND METHOD TO INCREASE SURFACE FRICTION ACROSS A HYDROPHOBIC-COATED SUBSTRATE, which provisional application is incorporated by reference herein in its entirety.

FIELD OF THE INVENTION

The present invention relates generally to a system and method to increase surface friction across a hydrophobic, anti-fouling, and oleophobic coated substrate. More so, the present invention relates to a system and method that increases surface friction, or roughness, across a hydrophobic-coated substrate by combining the effects of an ion cloud and an inert carrier gas that increases the ion cloud density; and further regulates the increases in surface friction by varying the duration that the hydrophobic-coated surface is exposed to the ion cloud, varying the power applied to the ion source, and varying the distance between the ion cloud and the hydrophobic-coated surface.

BACKGROUND OF THE INVENTION

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

Typically, it is desirable to improve performance, i.e., lifetime, abrasion wear resistance, and other durability properties of substrates, such as lenses. Because of the ease of scratching plastic and glass, it can be desirable to apply abrasion-resistant coatings onto the surface of such substrates. These hard-outer coatings increase the useful life of the substrates.

Those skilled in the art will recognize that a hydrophobic surface is generally slick, and not efficient for managing and controlling during manufacturing processes. In one type of hydrophobic substrate, a contact lens is made up of a core or bulk material that is highly oxygen permeable and hydrophobic. Often, the surface that has been treated or coated to increase hydrophilic properties, thereby allowing the lens to freely move on the eye without adhering excessive amounts of tear lipid and protein.

Other proposals have involved enhancing and increasing friction on hydrophobic surfaces of substrates. The problem with these gripping devices is that they do not magnify the force applied around the hose, and they are not compactable for facilitated stowage and transport. Also, the handle used to control the gripping device is not easily accessible. Even though the above cited surface enhancing methods meet some of the needs of the market, a system and method to increase surface friction across a hydrophobic, anti-fouling, and oleophobic coated substrate by immersing the hydrophobic surface in an ion cloud that can be varied in ion density, is still desired.

SUMMARY

Illustrative embodiments of the disclosure are generally directed to a system and method to increase surface friction across a hydrophobic, anti-fouling, and oleophobic coated substrate. The system and method is configured to increase the surface friction, or roughness, across the hydrophobic surface of the substrate (whether coated or not) by immersing the substrate surface in a dense ion cloud. The density of ions in the cloud, and other parameters can be adjusted to achieve a desired friction across the substrate surface. The increase in surface friction is accomplished by generating electrical power through an ion source, so that the ions are charged to form an ion cloud. The ion cloud is generated at a predetermined distance from the substrate surface. The ions interact with the hydrophobic-coated surface to create a roughing effect.

Further, the system and method introduces an inert carrier gas to the ion cloud via a gas carrier device. The introduction of inert gas works to increase the density of the ions, which in turn increases the surface friction of the substrate. The system and method is also operable to increase and decrease the extent of surface friction produced across the substrate surface through various adjusting processes, including: varying the duration that the hydrophobic surface is exposed to the ion cloud; varying the power applied to the ion source that generates the ion cloud; and varying the distance between the ion cloud and the hydrophobic surface.

In another aspect, the substrate is coated with an anti-fouling coating or an oleophobic coating.

In another aspect, the power source is an alternating current.

In another aspect, the ion source generates a cloud, beam, or stream of ions.

In another aspect, the roughing effect on the substrate surface increases proportionally with respect to increasing the amount of time the coating is exposed to the ion source, increasing power applied to the ion source, and decreasing the distance between the coating and the ion source.

In another aspect, the substrate is rotated while being immersed in the ion cloud.

One objective of the present invention is to create a roughing effect on a hydrophobic-coated substrate so that commonly used adhesives can adhere to the substrate, and so the substrate can be manipulated in any number of manufacturing processes.

Another objective is to increase the surface tension on a substrate.

Yet another objective is to coat a substrate, so as to improve performance, i.e., lifetime, abrasion wear resistance, and other durability properties.

Yet another objective is to provide a system that allows the roughness on the substrate to be increased by increasing the duration that the cloud engages the substrate, increasing the power from the power source, and decreasing the distance between the cloud and the hydrophobic-coated surface.

Another objective is to regulate the amount of roughness on the substrate surface by increasing proportionally with respect to increasing the amount of time the coating is exposed to the ion source, increasing power applied to the ion source, and decreasing the distance between the coating and the ion source.

Yet another objective is to provide an inexpensive, low capital method for roughening the surface of a substrate.

Other systems, devices, methods, features, and advantages will be or become apparent to one with skill in the art upon examination of the following drawings and detailed description. It is intended that all such additional systems, methods, features, and advantages be included within this description, be within the scope of the present disclosure, and be protected by the accompanying claims and drawings.

BRIEF DESCRIPTION OF THE DRAWINGS

The invention will now be described, by way of example, with reference to the accompanying drawings, in which.

Like reference numerals refer to like parts throughout the various views of the drawings.

DETAILED DESCRIPTION OF THE INVENTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper," "lower," "left," "rear," "right," "front," "vertical," "horizontal," and derivatives thereof shall relate to the invention as oriented in FIG. 1. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Specific dimensions and other physical characteristics relating to the embodiments disclosed herein are therefore not to be considered as limiting, unless the claims expressly state otherwise.

Figure 1:
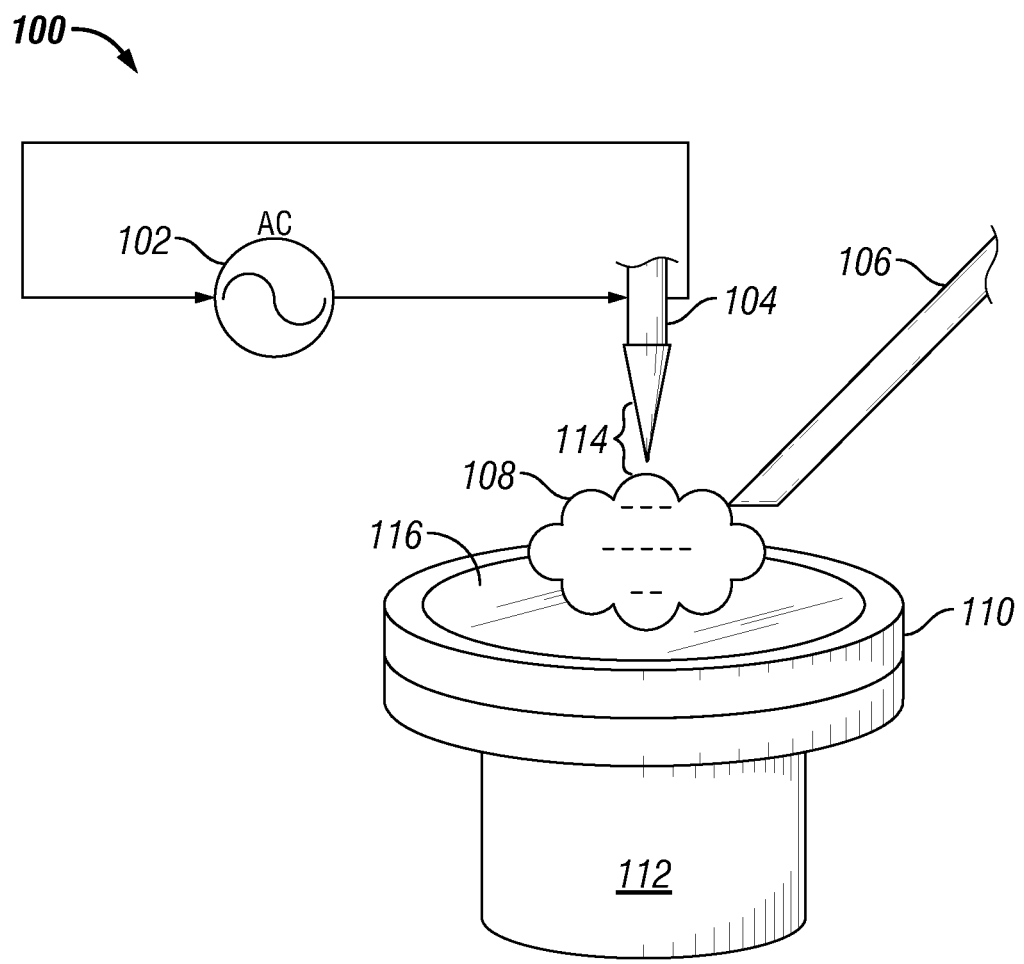
FIG. 1 illustrates a perspective view of an exemplary system to increase surface friction across a hydrophobic, anti-fouling, and oleophobic coated substrate, in accordance with an embodiment of the present invention.
Figure 2:
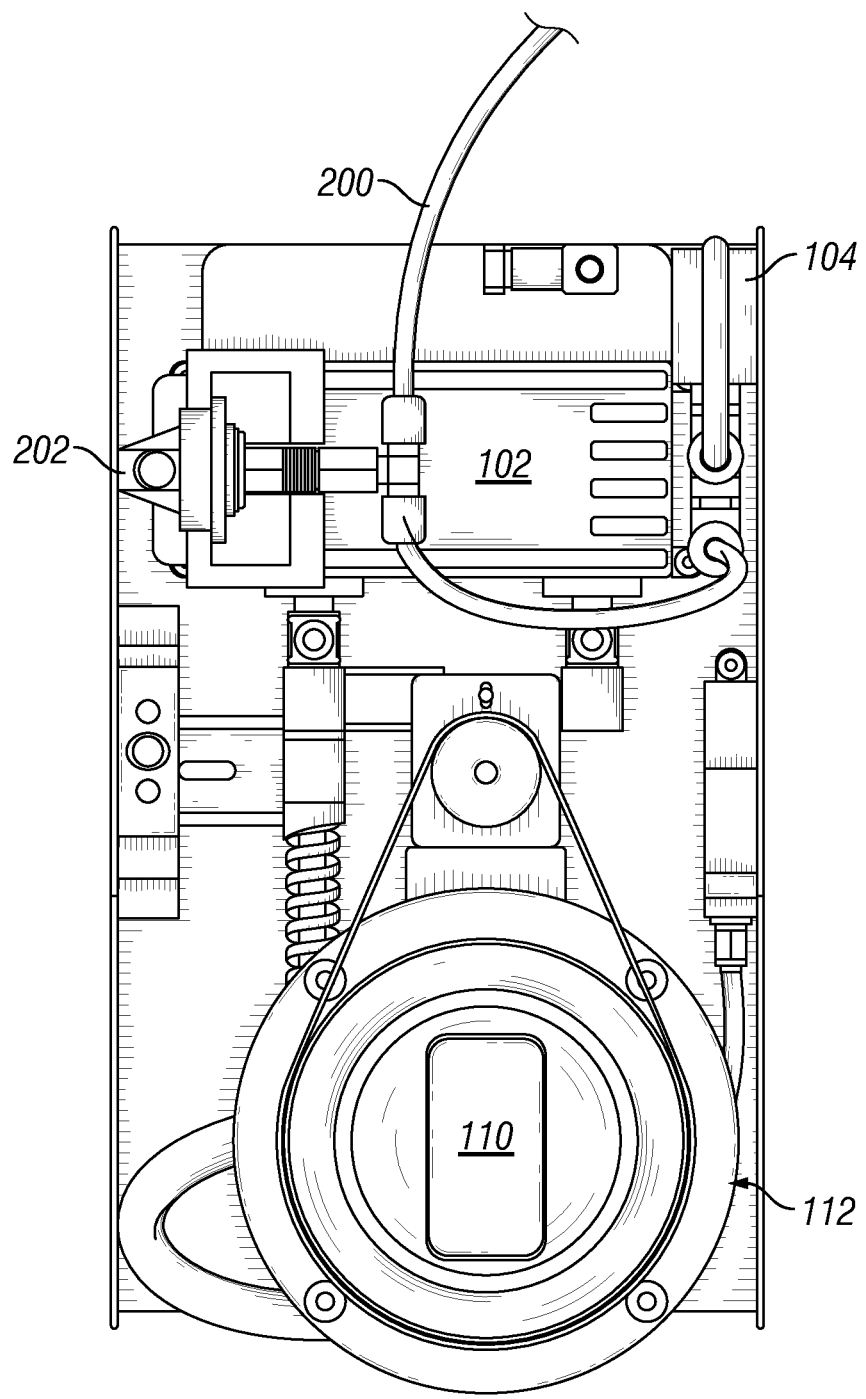
FIG. 2 illustrates a perspective view of the system, showing the ion source and power source positioned over the substrate, in accordance with an embodiment of the present invention.
Figure 3:
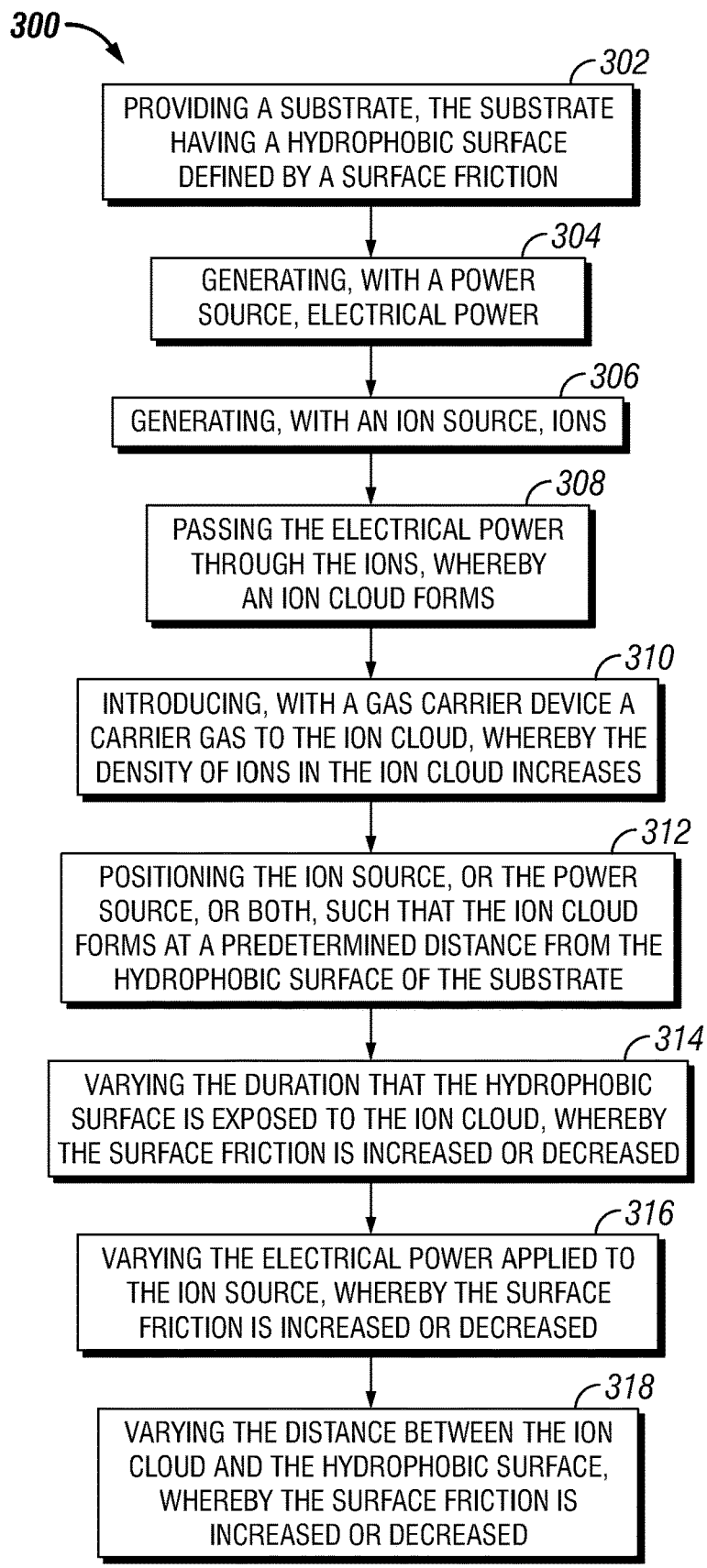
FIG. 3 illustrates a flowchart of an exemplary method to increase surface friction across a hydrophobic, anti-fouling, and oleophobic coated substrate, in accordance with an embodiment of the present invention.

A system 100 and method 300 to increase surface friction across a hydrophobic, anti-fouling, and oleophobic coated substrate is referenced in FIGS. 1-3. The system 100 to increase surface friction across a hydrophobic, anti-fouling, and oleophobic coated substrate surface, hereafter "system 100" is configured to increase the surface friction, or roughness, across a hydrophobic surface (or a superhydrophobic surface) of a substrate. The system 100 is also operable when the surface is coated with a hydrophobic, anti-fouling, and oleophobic coating. The system 100 works by immersing the substrate 110 in a dense cloud of ions. The extent of the roughness produces across the substrate surface can be regulated to increase and decrease by varying the density of the ion cloud, varying the distance between the hydrophobic surface and the ion cloud, and varying the intensity of the ion cloud during immersion of the substrate. Such surface roughening means can be efficacious for improving performance, i.e., lifetime, abrasion wear resistance, and other durability properties of a substrate, such as a lens. Any substrate having generally hydrophobic surface properties may, however, be enhanced through the system 100.

In one possible embodiment, the system 100 provides a simple set-up consisting of substantially: 1) an ion source 104 for generating an ion cloud in proximity to the substrate surface; 2) an inert gas carrier device 106 that delivers a carrier gas for increasing the density of the ion cloud; and 3) a rotating mount 112 for orienting and supporting the substrate while being immersed in the ion cloud 108. The ion cloud 108 is configured and positioned to interact with the hydrophobic-coated surface to create a roughing effect. This is possible because ion bombardment creates an etching effect on the surface of a substrate 110; thereby roughening the hydrophobic surface, even when coated with hydrophobic, superhydrophobic, anti-fouling, and oleophobic coatings.

In one embodiment, the system is operable on a substrate 110. The substrate may include a flat or concave lens, as shown in FIG. 1. In other embodiments, different substrates may also be used. In some possible embodiments, the substrate has a hydrophobic surface. In other embodiments, the substrate surface is coated with a hydrophobic coating, a superhydrophobic coating, an anti-fouling coating, and/or an oleophobic coating 116. The coating 116 may be applied in ultra-dry surface applications known in the art. Those skilled in the art will recognize that such a coating 116 can cause an imperceptibly thin layer of air to form on top of the surface of the substrate 110.

The ion source 104 (ion generator) generates a dense cloud of ions (cloud of atomic and molecular ions) that immerses the surface of the substrate. In one embodiment, a tube 200 carries the ions from the ion source 104 to the substrate 110. An ion outlet 202 in communication with the tube 200 discharges the ions. The ion cloud 108 is efficacious for roughening the surface, i.e., increasing friction, across the hydrophobic substrate surfaces (or superhydrophobic surfaces). This can be useful because hydrophobic surfaces may have a tendency to be slick, and not efficient for managing and controlling during manufacturing processes. In one possible embodiment, the coating 116 is applied prior to the immersion in the ion cloud 108.

The method is efficacious for roughening the surfaces across both hydrophobic and superhydrophobic surfaces. Those skilled in the art will recognize that the superhydrophobic surface is slicker than the standard hydrophobic surface. The superhydrophobic surface is a nanoscopic surface layer that repels water. For example, droplets hitting this kind of coating can fully rebound in the shape of a column. In one definition of superhydrophobic surface, as used in this invention, the superhydrophobic surface has a water contact angle of greater than 150° and a sliding angle of less than 10°.

Turning now to FIG. 2, the system 100 utilizes a high voltage power source 102 to generate electrical power. The electrical power may include a voltage or a current. The electrical power is used to pass through, and thereby increase the ion density of the ion cloud 108. In some embodiments, the power source 102 that generates the electrical power may include an alternating current (A/C). In one non-limiting embodiment, the electrical power is greater than 2 kilovolts. Though the system 100 is scalable, such that in some embodiments, a lesser or greater voltage may be used. In some embodiments, the power source 102 may include a battery that changes magnetic flux, and is linked with a conducting coil. Though other power sources known in the art may also be used.

The system 100 provides an ion source 104 to generate the aforementioned cloud of atomic and molecular ions. The ion source 104 is operatively connected to the power source 102. Because the power source 102 and the ion source 104 are operatively connected, an ion cloud 108 forms as the electricity generated by the power source 102 charges the ions created in the ion source 104. In one non-limiting embodiment, the cloud is an ion cloud 108. Though in other embodiments, the generated cloud 108 may include an ion stream or an ion beam may be generated by the ion source 104. In some embodiments, the ions may include molecular ions known in the art. In some embodiments, the ion source 104 may include, without limitation, an electrospray ionization, electron impact ionization (EI), and MALDI. The electrical power generated by the power source 102 passes through the generated ions.

The system 100 is unique in that the extent of the roughness produced across the surface of the substrate is variable, based on the desired surface friction thereon. The means for varying the surface friction on the surface may include varying the distance between the ion source and the surface. This, in essence, moves the ion cloud 108 closer and further from the substrate. In one embodiment, the ion cloud 108 is generated at a predetermined distance 114 from the substrate 110. As FIG. 2 illustrates, the predetermined distance 114 may be less than 12". The predetermined distance 114 may, however, be increased or decreased as required. Thus, because the system 100 is scalable, other distances greater or lesser may also be used.

In addition to the proximal and distal position of the ion source relative to the substrate 110; the substrate 110 is rotated on a rotating mount 112 while being immersed in the ion cloud 108. The rate of rotation may affect the extent of roughness/surface friction produced on the surface of the substrate 110. The rotating mount 112 may include an electrically powered mount that is in communication with the ion source, such that the ion source generates ion cloud in proportion to the rate of rotation.

Further, the system 100 is unique in that the surface friction on the substrate is substantially increased through use of a gas carrier device 106 that introduces an inert carrier gas to the ion cloud 108. The inert carrier gas serves to increase the density of the ions, which in turn increases the surface friction on the hydrophobic-coated substrate 110. The inert carrier gas may include those known in the art, including, a noble gas, helium, argon, neon, xenon, krypton, and radon. The inert gas may be discharged directly into the ion cloud. Or in other embodiments, the carrier gas is introduced in a more gradual manner.

The system 100 is also unique in that the surface friction can be increased and decreased. The duration that the hydrophobic-coated surface of the substrate is exposed to the ion cloud 108 can vary the surface friction. In one example of increasing the surface friction, the surface friction of the substrate 110 increases by increasing the amount of time that the surface is exposed to the ion cloud 108.

In another possible means for varying the extent of roughness applied to the substrate surface, the amount of power applied to the ion source 104 can be manipulated. This can be performed by manually or presetting the alternating current or voltage of the power source 102. In one example of increasing the surface friction, the surface friction of the substrate 110 increases by increasing the amount of electrical power generated by the power source 102.

Additionally, the extent of roughness/friction applied to the substrate surface is possible by varying the distance between the ion cloud 108 and the hydrophobic-coated surface. In one example of increasing the surface friction, the surface friction of the substrate 110 increases by decreasing the distance between the ion cloud 108 and the hydrophobic-coated surface. This is possible by raising the rotatable mount on which the substrates rests, or by lowering the ion source 104 or power source 102 to a more proximal position to the substrate 110.

In accordance with the system 100 described above, FIG. 3 illustrates a flowchart of an exemplary method 300 to increase surface friction across a hydrophobic-coated substrate. The method 300 may include an initial Step 302 of providing a substrate, the substrate having a hydrophobic surface defined by a surface friction. The rate of rotation may also affect the extent of roughness on the surface of the substrate 110. The rotating mount 112 may include an electrically powered mount that is in communication with the ion source, such that the ion source generates ion cloud in proportion to the rate of rotation. The method 300 may further comprise a Step 304 of generating, with a power source, electrical power. In one non-limiting embodiment, the electrical power is at least 2 kilovolts. A Step 306 includes generating ions with an ion source 104. The ions may include molecular ions known in the art.

In some embodiments, a Step 308 comprises passing the electrical power through the ions, whereby an ion cloud forms. A Step 310 may include introducing, with a gas carrier device a carrier gas to the ion cloud, whereby the density of ions in the ion cloud increases. An additional Step may include rotating the substrate on a rotating mount while being immersed in the ion cloud. A Step 312 includes positioning the ion cloud at a predetermined distance from the hydrophobic surface of the substrate, whereby the hydrophobic surface immerses in the ion cloud, whereby the surface friction of the hydrophobic surface increases.

In some embodiments, a Step 314 may include varying the duration that the hydrophobic surface is exposed to the ion cloud, whereby the surface friction of the hydrophobic surface is increased or decreased. A Step 316 comprises varying the electrical power applied to the ion source, whereby the surface friction of the hydrophobic surface is increased or decreased. The method 300 may further comprise a Step 318 of varying the duration that the hydrophobic-coated surface is exposed to the ion cloud 108, whereby the surface friction is increased or decreased. A Step 320 includes varying the distance between the ion cloud and the hydrophobic surface, whereby the surface friction of the hydrophobic surface is increased or decreased.

In sum, the system 100 and method 300 work to increase surface friction across a hydrophobic-coated substrate having a hydrophobic surface defined by a surface friction works to increases the surface friction, or roughness, across the hydrophobic surface of substrate. The increase in surface friction is accomplished by generating power through an ion source to create an ion cloud. The ion cloud is generated at a predetermined distance from the substrate. The ions interact with the hydrophobic surface to create a roughing effect thereon. A gas carrier device introduces an inert carrier gas through the ion cloud to increase the density of the ions, which in turn increases the surface friction. The system is variable, selectively increasing and decreasing the surface friction by: varying the duration that the hydrophobic surface is exposed to the ion cloud; varying power applied to the ion source; and varying the distance between the ion cloud and the hydrophobic surface.

Although the process-flow diagrams show a specific order of executing the process steps, the order of executing the steps may be changed relative to the order shown in certain embodiments. Also, two or more blocks shown in succession may be executed concurrently or with partial concurrence in some embodiments. Certain steps may also be omitted from the process-flow diagrams for the sake of brevity. In some embodiments, some or all the process steps shown in the process-flow diagrams can be combined into a single process.

These and other advantages of the invention will be further understood and appreciated by those skilled in the art by reference to the following written specification, claims and appended drawings.

Because many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalence.

What is claimed is:

1. A method to increase surface friction across a hydrophobic substrate, the method comprising:
    providing a substrate, the substrate having a hydrophobic surface, or a superhydrophobic surface, the surfaces being defined by a surface friction;
    generating, with a power source, electrical power;
    generating ions with an ion source, the ion source being operatively connected to the power source,
    whereby the operative connection between the ion source and the power source causes the electrical power to charge the ions, causing formation of an ion cloud;
    introducing, with a gas carrier device a carrier gas to the ion cloud, whereby the density of ions in the ion cloud increases;
    positioning the ion cloud at a predetermined distance from the hydrophobic surface of the substrate, whereby the hydrophobic surface immerses in the ion cloud, whereby the surface friction of the hydrophobic surface increases;
    varying the duration that the hydrophobic surface is exposed to the ion cloud, whereby the surface friction of the hydrophobic surface is increased or decreased;
    varying the electrical power applied to the ion source, whereby the surface friction of the hydrophobic surface is increased or decreased; and
    varying the distance between the ion cloud and the hydrophobic surface, whereby the surface friction of the hydrophobic surface is increased or decreased.

2. The method of claim 1, further comprising a step of coating the hydrophobic surface of the substrate with a coating.

3. The method of claim 2, wherein the coating comprises an anti-fouling coating or an oleophobic coating.

4. The method of claim 1, further comprising a step of rotating the substrate on a rotating mount.

5. The method of claim 1, wherein the power source generates an alternating current.

6. The method of claim 1, wherein the electrical power is at least 2 kilovolts.

7. A method to increase surface friction across a hydrophobic substrate, the method comprising:
    providing a substrate, the substrate having a hydrophobic surface, or a superhydrophobic surface, the surfaces being defined by a surface friction;
    coating the hydrophobic surface of the substrate with a coating;
    generating, with a power source, electrical power;
    generating ions with an ion source, the ion source being operatively connected to the power source,
    whereby the operative connection between the ion source and the power source causes the electrical power to charge the ions, causing formation of an ion cloud or an ion stream;
    introducing, with a gas carrier device a carrier gas to the ion cloud or the ion stream, whereby the density of ions in the ion cloud or the ion stream increases;
    positioning the ion cloud or the ion stream at a predetermined distance from the hydrophobic surface of the substrate, whereby the hydrophobic surface immerses in the ion cloud or the ion stream, whereby the surface friction of the hydrophobic surface increases;
    rotating the substrate on a rotating mount;
    varying the duration that the hydrophobic surface is exposed to the ion cloud or the ion stream, whereby the surface friction of the hydrophobic surface is increased or decreased;
    varying the electrical power applied to the ion source, whereby the surface friction of the hydrophobic surface is increased or decreased; and
    varying the distance between the ion cloud or the ion stream, and the hydrophobic surface, whereby the surface friction of the hydrophobic surface is increased or decreased where the ion impact source includes at least one of the following: an electrospray ionization, an electron impact ionization, and a MALDI.

8. The method of claim 7, wherein the coating comprises an anti-fouling coating or an oleophobic coating.

9. The method of claim 7, wherein the power source generates an alternating current.

10. The method of claim 7, wherein the electrical power is at least 2 kilovolts.

11. The method of claim 7, wherein the ion source is operatively connected to the power source.

12. A system to increase surface friction across a hydrophobic substrate, the method comprising:
    a substrate having a hydrophobic surface, or a superhydrophobic surface, the surfaces being defined by a surface friction;
    a coating at least partially covering the hydrophobic surface of the substrate;
    a power source generating electrical power;
    an ion source operatively connected to the power source, the ion source producing ions,
    whereby the operative connection between the ion source and the power source, causes the electrical power to charge the ions, causing formation of an ion cloud;
    a tube carrying the ions from the ion source to the substrate;
    ion outlet in communication with the tube operable to discharge the ions, the ion outlet being proximal to the power source;
    a gas carrier device introducing a carrier gas through the ion cloud, whereby the density of ions in the ion cloud increases; and a rotating mount rotating the substrate in proximity to the ion cloud, whereby the hydrophobic surface immerses in the ion cloud, whereby the surface friction of the hydrophobic surface increases;

whereby the surface friction of the hydrophobic surface is increased or decreased by varying the duration that the hydrophobic surface is exposed to the ion cloud, whereby the surface friction of the hydrophobic surface is increased or decreased by varying the electrical power applied to the ion source, whereby the surface friction of the hydrophobic surface is increased or decreased by varying the distance between the ion cloud and the hydrophobic surface.

13. The system of claim 12, wherein the coating comprises an anti-fouling coating or an oleophobic coating.

14. The system of claim 12, wherein the electrical power is at least 2 kilovolts.

15. The system of claim 12, wherein the ion source includes at least one of the following: an electrospray ionization, electron impact ionization, and a MALDI.

* * * * *